United States Patent
Hwang

[11] Patent Number: 6,021,089
[45] Date of Patent: Feb. 1, 2000

[54] ADDRESS TRANSITION DETECTION CIRCUIT

[75] Inventor: Myoung-Ha Hwang, Chungcheongbuk-do, Rep. of Korea

[73] Assignee: LG Semicon Co., Ltd., Cheongju, Rep. of Korea

[21] Appl. No.: 09/198,272

[22] Filed: Nov. 24, 1998

[30] Foreign Application Priority Data

Feb. 25, 1998 [KR] Rep. of Korea ............ 98-5906

[51] Int. Cl.[7] .................. G11C 8/00; G11C 7/00
[52] U.S. Cl. ............... 365/233.5; 365/194; 365/189.11
[58] Field of Search ............... 365/233.5, 194, 365/189.11

[56] References Cited

U.S. PATENT DOCUMENTS

| | | | |
|---|---|---|---|
| 5,073,872 | 12/1991 | Masuda et al. | 365/233.5 |
| 5,319,607 | 6/1994 | Fujii et al. | 365/233.5 |
| 5,606,269 | 2/1997 | Pontius et al. | 365/233.5 |
| 5,627,796 | 5/1997 | Park et al. | 365/233.5 |
| 5,696,463 | 12/1997 | Kwon | 365/233.5 |
| 5,734,282 | 3/1998 | Choi et al. | 365/233.5 |

*Primary Examiner*—Trong Phan
*Attorney, Agent, or Firm*—Fleshner & Kim

[57] ABSTRACT

The present invention relates to an address transition detection (ATD) circuit that generates an address transition detection signal having a prescribed pulse width by detecting a logic transition of an input address bit. The ATD circuit includes a low-to-high first delaying circuit that receives the address bit to delay an output of the address bit of high level but outputs the address bit of low level without a delay. A high-to-low second delaying circuit receives the address bit to output the address bit of high level without a delay, but delays an output of the address bit of low level. A logic gate receives address bit from the first and second delaying circuits output to an address transition detection signal. A feed-back control circuit receives the address transition detection signal to cancel a delaying process of the first and second delaying circuits.

20 Claims, 7 Drawing Sheets

FIG.3A AIN 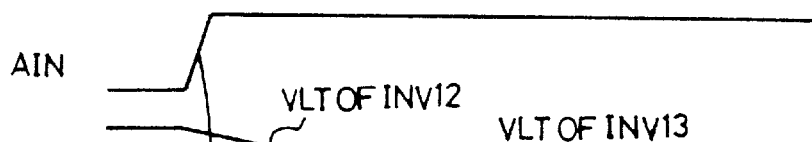
FIG.3B N10 
FIG.3C N11 
FIG.3D N12 
FIG.3E N13 
FIG.3F N14 
FIG.3G N20 
FIG.3H N21 
FIG.3I N22 
FIG.3J N23 
FIG.3K N24 
FIG.3L N25 

FIG. 4A AIN
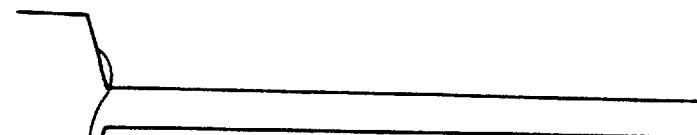
FIG. 4B N10
FIG. 4C N11
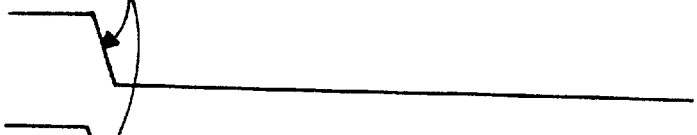
FIG. 4D N12
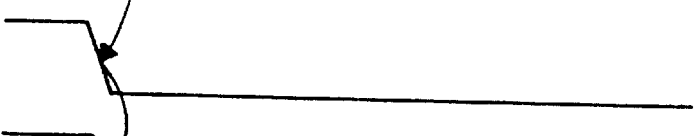
FIG. 4E N13
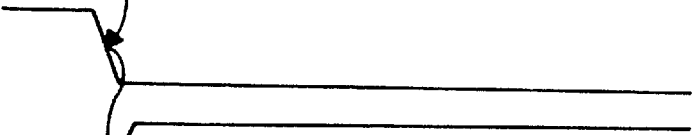
FIG. 4F N14
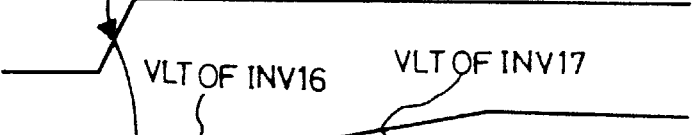
FIG. 4G N20
FIG. 4H N21
FIG. 4I N22
FIG. 4J N23
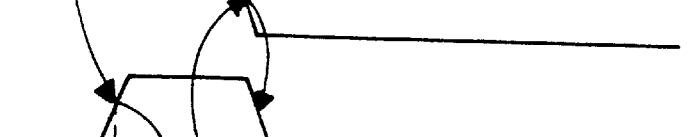
FIG. 4K N24 (ATD)
FIG. 4L N25
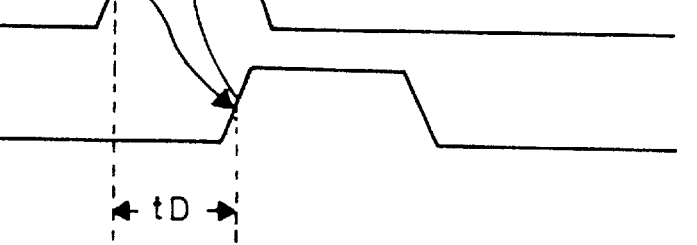

FIG.5A AIN 
FIG.5B N10(H) 
FIG.5C N11(L) 
FIG.5D N12(L) 
FIG.5E N13(L) 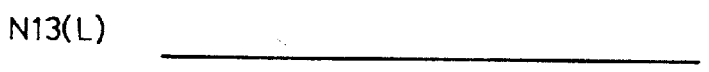
FIG.5F N14(H) 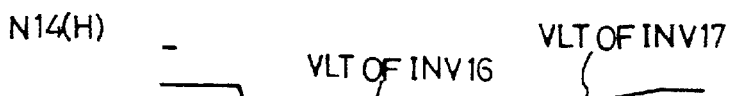
FIG.5G N20 
FIG.5H N21 
FIG.5I N22 
FIG.5J N23 
FIG.5K N24 (ATD) 
FIG.5L N25 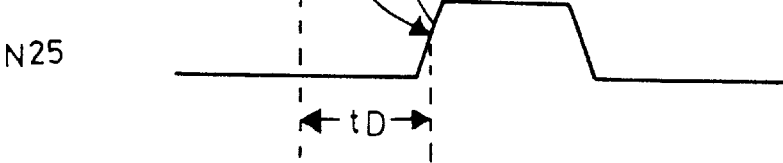

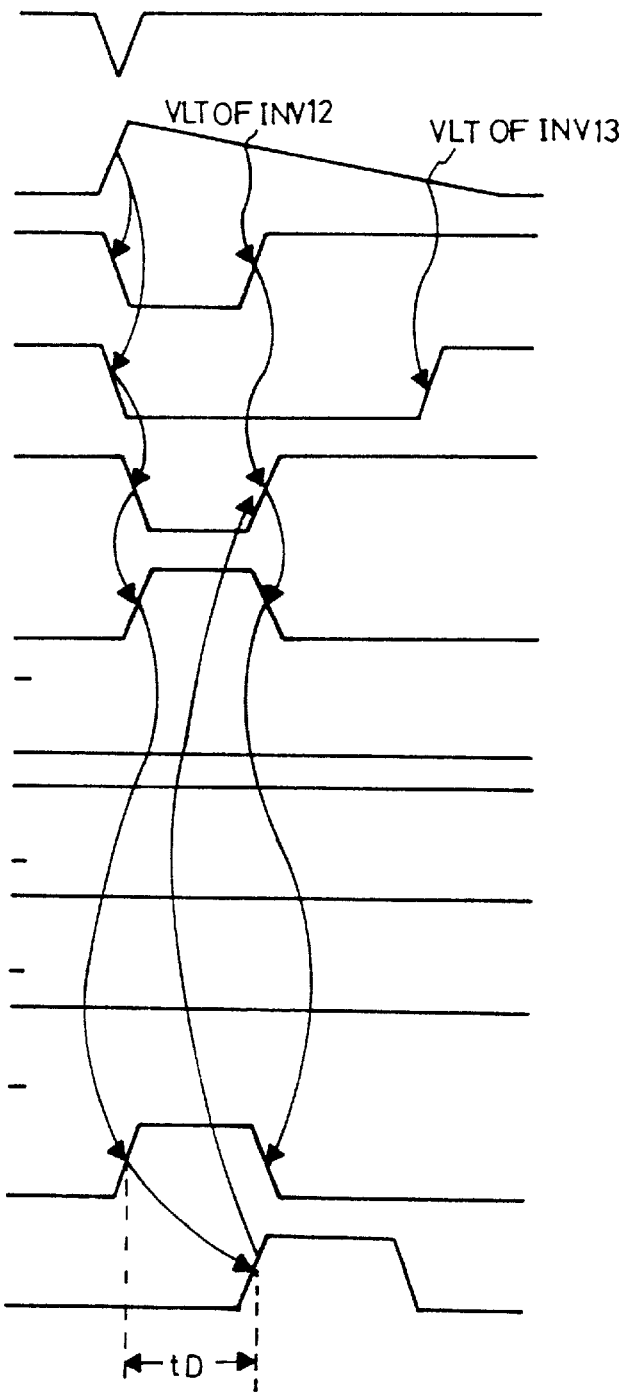
FIG. 6A  AIN
FIG. 6B  N10
FIG. 6C  N11
FIG. 6D  N12
FIG. 6E  N13
FIG. 6F  N14
FIG. 6G  N20(L)
FIG. 6H  N21(H)
FIG. 6I  N22(H)
FIG. 6J  N23(H)
FIG. 6K  N24 (ATD)
FIG. 6L  N25

ADDRESS TRANSITION DETECTION CIRCUIT

BACKGROUND OF THE INVENTION

1. Field of Invention

The present invention relates to an address transition detection circuit, and in particular, to an address transition detection circuit that generates an address transition detection signal having a prescribed pulse width.

2. Discussion of Related Art

A pulse width of an address transition detection signal maintains a data reading cycle. The address transition detection signal in DRAM is generated from a column address path.

In a static column mode, a data in bitline is outputted in turn according to an input of the column address where a signal synchronized by an address input such as /CAS is required to control a data transmission and an activation of related circuits. In the static mode, the /CAS signal is not inputted again after a second bit but, instead, a variety of controlling signals to access a data are provided by generating an address transition detection signal.

The Address Transition Detection (ATD) circuit into which a column address is inputted generates an ATD signal by detecting the address transition. While the ATD signal is activated, speed of transmitting a data is increased and power consumption is reduced by pre-charging a data bus line up to a fixed level, which is usually VCC/2. FIG. 1 shows a prior art ATD circuit. As shown in FIG. 1, if an address bit AIN inputted into the ATD circuit goes from low to high level, a signal of node N5, which is an output signal of an inverter INV1 indicates low level, and a signal of node N2, which is an output signal of an inverter INV2, indicates high level. The inverters INV1 and INV2 are connected in series. A transmission gate TG1 is turned on and a transmission gate TG2 is turned off by the signals of the node N2 and the node N5. The high level signal of the node N2 is applied to a NAND gate NAND1 through two paths. A first path is a direct path and a second path is a delaying path that consists of inverters INV3 and INV4 and capacitors C1 and C2. Hence, an output signal of the NAND gate NAND 1 becomes a pulse signal having a high level pulse width equal to a time delayed by the delaying path. The pulse signal from the NAND gate NAND1 is outputted as an ATD signal through the turned-on transmission gate TG1.

When an address bit AIN goes from high to low level, a signal of the node N5 becomes high level and the node N2 becomes low level. Hence, the transmission gate TG1 is turned off, while the transmission gate TG2 is turned on. The low level signal of the node N5 is inputted into the NAND gate NAND2 through a direct path and a delaying path consisting of the inverters INV5 and INV6 and the capacitors C3 and C4. An output signal of the NAND gate NAND2 becomes a pulse signal having a high level pulse width equal to a time delayed by the delaying path. Then, the pulse signal from the NAND gate NAND2 is outputted as an ATD signal through the turned on transmission gate TG2.

As described above, the prior art ATD circuit has various problems. If a positive short pulse having a pulse width shorter than a normal address bit is inputted into the related art ATD circuit, the node N5 signal becomes a negative short pulse, which is inputted into the NAND gate NAND2 through the direct path and the delaying path INV5, C3, INV6 and C4. The node N2 signal becomes a positive short pulse, which is inputted into the NAND gate NAND1 through the direct path and the delaying path INV3, C1, INV4 and C2. However, such short pulses are less than a time to respectively turn on or off the transmission gates TG1 and TG2 produce the output signals of the NAND gates NAND1 and NAND2 as ATD signals. Further, the logic values of the NAND gates NAND1 and NAND2 are unreliable when the pulse widths of the short pulses are shorter than the delayed time in the delaying path consisting of the inverters and capacitors in the prior art ATD circuit.

The above references are incorporated by reference herein where appropriate for appropriate teachings of additional or alternative details, features and/or technical background.

SUMMARY OF THE INVENTION

An object of the present invention is to provide an address transition detection circuit that substantially obviates one or more of the problems caused by limitations and disadvantages of the related art.

Another object of the present invention is to provide an address transition detection circuit that generates an ATD signal having a prescribed pulse width. Another object of the present invention is to provide an address transition detection circuit that generates an ATD signal having a prescribed pulse width although a pulse having a pulse width much shorter than that of a received input address bit is received.

To achieve at least these and other advantages in a whole or in parts and in accordance with the purpose of the present invention, as embodied and broadly described, an address transition detection circuit is provided that includes a first delay circuit that receives an address signal, wherein the first delay circuit delays a first level address signal when the address signal transitions from second level to a first level, and wherein the first delay circuit outputs a second level address signal when the address signal transitions from the first level to the second level; a second delay circuit that receives the address signal, wherein the second delay circuit delays the second level address signal when the address signal transitions from the first level to the second level, wherein the second delay circuit outputs the first level address signal when the address signal transitions from the second level to the first level, and wherein an output operation of the first and second delay circuits are controlled by a prescribed signal; and a control circuit that receives first and second address signals from the first and second delay circuits, respectively, to output an address transition detection signal and the prescribed signal to cancel the delay of the first and second delay circuits after a prescribed interval.

To achieve at least the above-described objects in a whole or in parts there is provided a method of operating an address transition detection circuit according to the present invention that includes receiving an address signal; delaying a first level address signal when the address signal transitions from a second level to a first level and outputting a second level address signal when the address signal transitions from the first level to the second level with a first delay circuit; delaying the second level address signal when the address signal transitions from the first level to the second level and outputting the first level address signal when the address signal transitions from the second level to the first level with a second delay circuit; selecting an output signal from the first and second delay circuits; combining the selected output signal from the first and second delay circuits to generate an address transition detection signal; and feeding back a prescribed signal after a prescribed interval to cancel the delay of the first and second delay circuits.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 3A–3L are diagrams that shows timing waveforms of operational characteristics of the ATD circuit of FIG. 2 that receives an address going from low to high level;

FIGS. 4A–4L are diagrams that shows timing waveforms of operational characteristics of the ATD circuit of FIG. 2 that receives an address going down from high to low level;

FIGS. 5A–5L are diagrams that shows timing waveforms of operational characteristics of the ATD circuit of FIG. 2 that receives a short pulse signal of high level;

FIGS. 6A–6L are diagrams that shows timing waveforms of operational characteristics of the ATD circuit of FIG. 2 that receives a short pulse signal of low level;

DETAILED DESCRIPTION OF PREFERRED EMBODIMENTS

Figure 1:
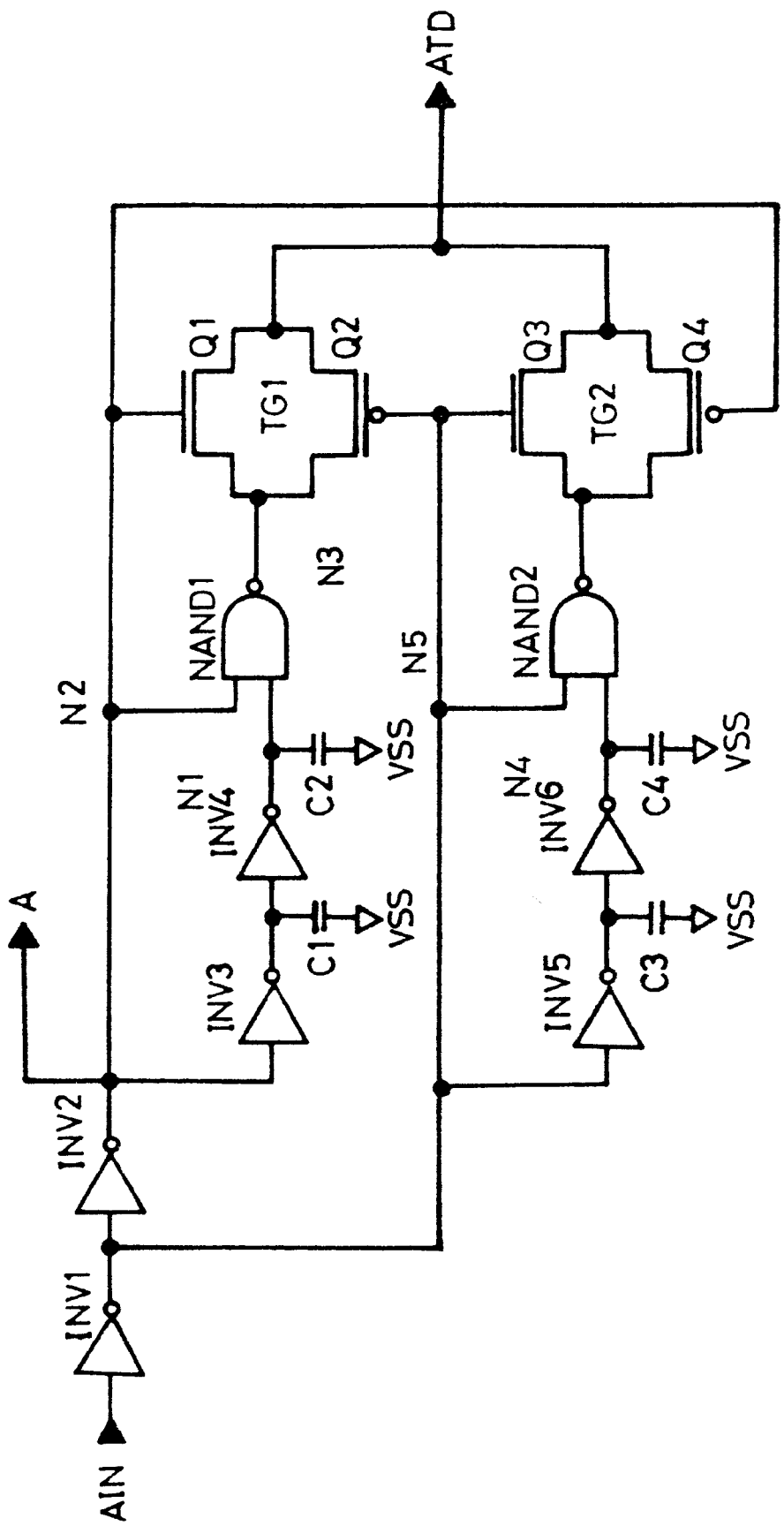
FIG. 1 is a diagram that shows a prior art address transition detection circuit.
Figure 2:
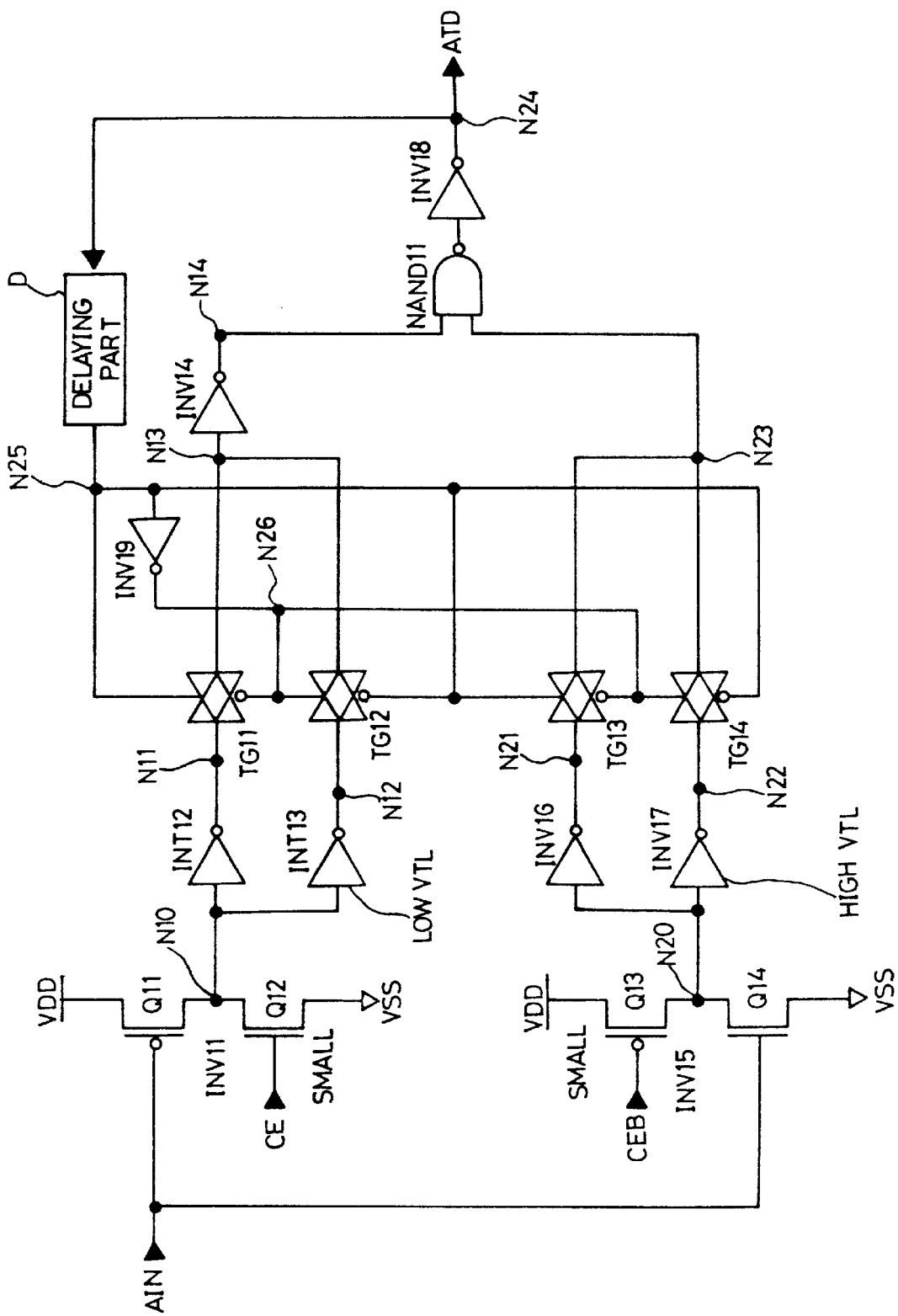
FIG. 2 is a diagram that shows a preferred embodiment of an address transition detection (ATD) circuit according to the present invention.

FIG. 2 to FIG. 6 are diagrams illustrating circuitry and waveforms of operational characteristics of a preferred embodiment of an address transition detection (ATD) circuit according to the present invention. As shown in FIG. 2, an inverter INV11 preferably includes a PMOS pull-up transistor Q11 and a NMOS pull-down transistor Q12, which are coupled to each other in series. A power supply voltage VDD is applied to a source of the PMOS transistor Q11 and an address bit AIN is applied its gate. In the NMOS transistor Q12, which has relatively less driving capacity than the PMOS transistor Q11, a drain is coupled to a drain of the PMOS transistor Q11 to form an output terminal N10. A source of the NMOS transistor Q12 is grounded.

A chip enabling signal CE is inputted into a gate of the NMOS transistor Q12. When the chip enabling signal CE is activated as a chip selecting signal so is the ATD circuit of the preferred embodiment of the present invention. Since a driving capacity of the NMOS transistor Q12 is less than that of the PMOS transistor Q11, a variation speed of the voltage level at the output terminal N10 varies according to a transition direction (e.g., high-to-low level or low-to-high level) of the inputted address bit AIN.

Figure 7:
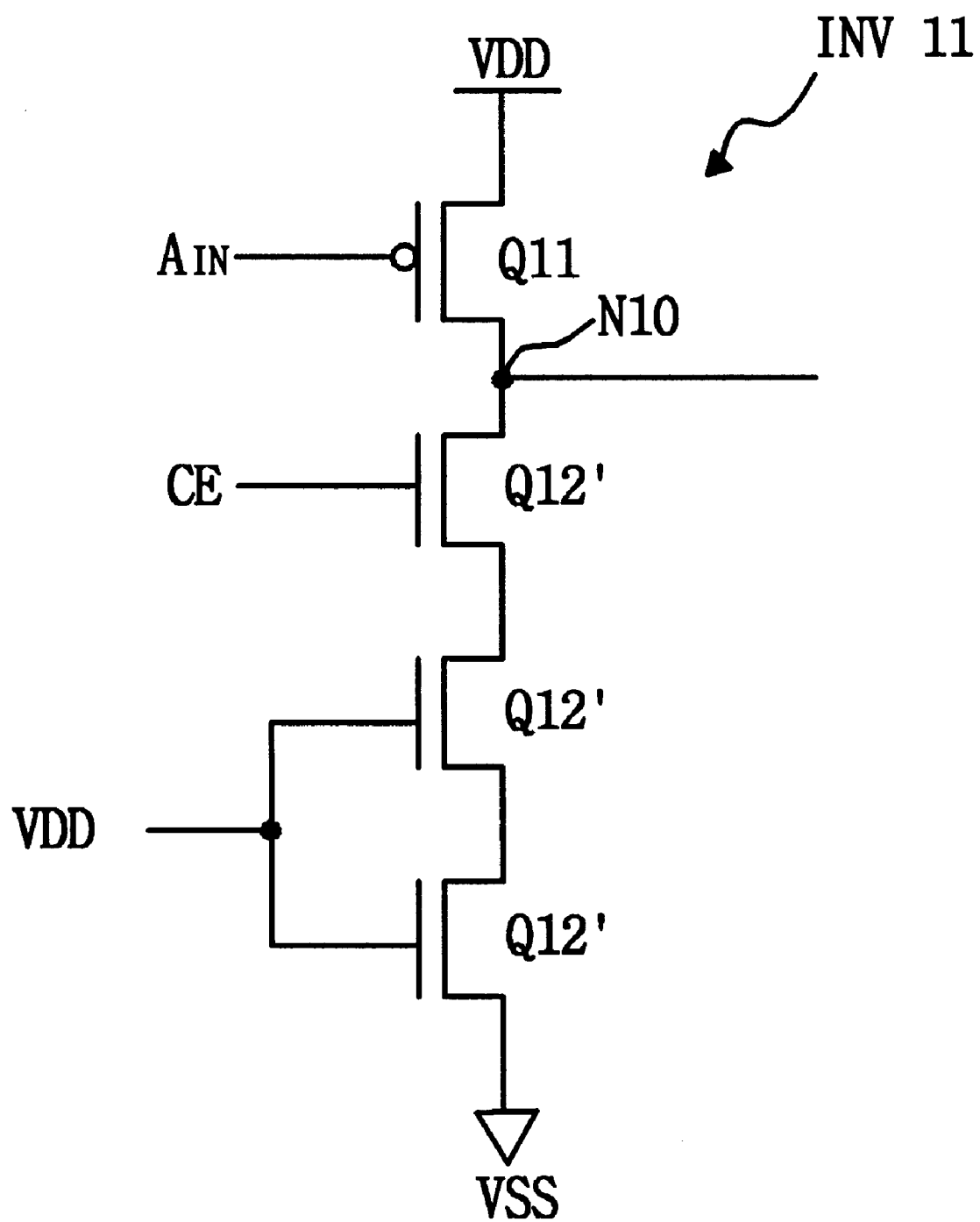
FIG. 7 is a diagram that shows an exemplary inverter of the ATD circuit of FIG. 2.

While the NMOS transistor Q12 is turned on by the chip enabling signal CE, a low level address bit AIN is applied to the PMOS transistor Q11. In this case, the PMOS transistor Q11 becomes turned on and the normal speed (i.e., fast) pull-up operation is performed. On the other hand, a pull-down operation is carried out by turning on the NMOS transistor Q12 once a high level address bit AIN is received to turn off the PMOS transistor Q11. In this case, the speed of the pull-down operation is preferably significantly slower than that of the pull-up operation since the NMOS transistor Q12 has relatively less driving capacity than the PMOS transistor Q11. For example, a ratio of width vice length of a channel between the source and drain of the NMOS transistor Q12 is smaller than that of the PMOS transistor Q11. Alternatively, as shown in FIG. 7, the pull-down operation of the inverter INV11 can be performed by a plurality of NMOS transistors Q12' coupled in series, each having the same size in channel width and length as the PMOS transistor Q11 performing the pull-up operation.

An output signal of the inverter INV11 is inverted by other pair of inverters INV12 and INV13 coupled in parallel. As the inverter INV13 preferably has a lower logic threshold voltage than the inverter INV12, signals of high level are outputted by each of the inverters INV12 and INV13 with a little difference in time.

The logic threshold voltage VLT of the inverter INV13 is lower than that of the other inverter INV12. Thus, an output voltage of the inverter INV11 that descends by the pull-down operation asynchronously reaches the logic threshold voltages of the inverters INV12 and INV13. The difference in time is relatively large because the pull-down operation of the inverter INV12 progresses slowly. A signal of high level is produced from the inverter INV12 and then, the signal of high level is outputted by the inverter INV13. In contrast, when an output signal of the inverter INV11 goes from low to high level, which is the pull-up operation, output signals of low levels are produced from each of the inverters INV12 and INV13 at nearly the same time. Thus, the voltage of the output terminal N10 satisfies both of the logic threshold voltages of the inverters INV12 and INV13 at almost the same time since the pull-up operation of the inverter INV11 progresses rapidly.

Each output signal of the inverters INV12 and INV13 is respectively controlled by each transmission gate TG11 and TG12. Input paths controlled by the transmission gates TG11 and TG12 that pass the output signals of the inverters INV12 and INV13 are inputted into an inverter INV14. On-off operations of the transmission gates TG11 and TG12 are also preferably complementary since transmission gates TG11 and TG12 are controlled by complementary controlling signals.

An inverter INV15 preferably includes a PMOS pull-up transistor Q13 and a NMOS pull-down transistor Q14, which are coupled to each other in series. The power supply voltage VDD is applied to a source of the PMOS transistor Q13, which has less driving capacity than NMOS transistor Q14. A gate of the PMOS transistor Q13 receives a chip enabling bar signal CEB, which is a complement to the chip enabling signal CE. A drain of the PMOS transistor Q13 is coupled to a drain of the NMOS transistor Q14 to form an output terminal N20. A source of the NMOS transistor Q14 is grounded, and a gate of the NMOS transistor Q14 receives the address bit AIN.

A changing speed of voltage level of the output terminal N20 varies in accordance with a transition direction (e.g., high-to-low level or low-to-high level) of the inputted address bit AIN since the driving capacity of the PMOS transistor Q13 is less than that of the NMOS transistor Q14. A normal speed (i.e., fast) pull-down operation is achieved by turning on the NMOS transistor Q14 by an address bit AIN of high level, while the PMOS transistor Q13 is turned on by the chip enabling bar signal CEB.

However, the NMOS transistor Q14 is turned off once a low level address bit AIN is inputted to perform the pull-up operation with the PMOS transistor Q13 having already been turned on. The progress speed of the PMOS transistor Q13 is slower than that of the pull-down operation because the driving capacity of the PMOS transistor Q13 is much less than that of the NMOS transistor Q14.

An output signal of the inverter INV15 is inverted by a pair of inverters INV16 and INV17 that are coupled in parallel. The inverter INV17 preferably has a higher logic threshold voltage VLT than the inverter INV16. Hence, output signals of high levels are produced from the inverters INV16 and INV17 at approximately the same time while an output signal of the inverter INV15 goes down from high to low level. As the pull-down operation of the inverter INV15 makes rapid progress, the voltage at the output terminal N20 reaches the logic threshold voltages at almost the same time.

On the other hand, there is a prescribed difference in time between the two inverters INV16 and INV17 producing signals of low levels when the output signal of the inverter INV15 goes from low to high level, which means a pull-up operation occurs. Thus, the output voltage of the inverter INV15 asynchronously reaches each logic threshold voltage of the inverters INV16 and INV17 in the pull-up operation. The prescribed difference in time is relatively large because the pull-up operation of the inverter INV15 makes very slow progress. Accordingly, a signal of low level is outputted by the inverter INV17 after a signal of low level has been produced from the other inverter INV16.

An output signal of the inverter INV14 and an output signal of one of the transmission gates TG13 or TG14 are applied to a NAND gate NAND11. The output signal of the NAND gate NAND11 is inverted by the inverter INV18 and output as the address transition detection (ATD) signal. Sequentially, the NAND gate NAND11 and the inverter INV18 make an AND gate.

A delaying part D to which the ATD signal has been inputted delays the ATD signal for a prescribed period and then outputs the signal as a feedback mechanism to control the on-off operations of the four transmission gates TG11 to TG14. An output signal of the delaying part D, (i.e. the delayed ATD signal) operates as a control signal that is inverted by the inverter INV19 and then delivered or is directly delivered to the four transmission gates TG11 to TG14. An output signal of high level from the delaying part D turns on the transmission gates TG11 and TG13 while the low level output signal turns on the transmission gates TG12 and TG14.

FIG. 3 and FIG. 4 are timing diagrams showing the operation characteristics when address bits having normal pulse widths are inputted to the ATD circuit of FIG. 2. FIG. 3 shows the waveforms of operational characteristics of the preferred embodiment of the ATD circuit in FIG. 2 when an address going from low to high level is received. FIG. 4 shows the waveforms of operational characteristics of the preferred embodiment of the ATD circuit in FIG. 2 and when the address going from high to low level is received.

At the initial state where the chip enabling signal CE is activated up to high level, the NMOS transistor Q12 of the inverter INV11 and the PMOS transistor Q13 of the inverter INV15 are concurrently turned on. Once the address bit AIN goes from low to high level, the PMOS transistor Q11 of the inverter INV11 becomes turned off and the NMOS transistor Q14 of the inverter INV15 becomes turned on.

A pull-down operation by the NMOS transistor Q12, which was already turned on, makes slow progress when the PMOS transistor Q11 becomes turned off in the inverter INV11. Although a signal of high level is produced promptly from the inverter INV12, the high level signal is not initially produced from the inverter INV13. During that time interval, the ATD signal has a value of low level. Thus, an output signal of the delaying part D has a value of low level as well. Accordingly, the transmission gate TG11 is turned off, while the other transmission gate TG12 is turned on.

As a high level output signal in the inverter INV12 has not passed through the transmission gate TG11 yet and an output signal of the inverter INV13 remains still at low level, the output signal of the inverter INV14 also maintains the high level of the initial value. Input-output waveforms according to such a series of operations are shown in FIGS. 3A to 3F.

In the inverter INV15, even though the PMOS transistor Q13 has already been turned on, the pull-down operation makes rapid progress according to the turned-on state of the NMOS transistor Q14, which has more driving capacity than the PMOS transistor Q13. Accordingly, high levels signals are produced from both inverters INV16 and INV17 at almost the same time. As the transmission gate TG14 has been turned on, an output signal of the inverter INV17 is directly inputted to the NAND gate NAND11.

The output signal of the NAND gate NAND11 becomes low level since both inputs of the NAND gate NAND11 are high levels. Inverted from low level by the inverter INV18, the output signal from the NAND gate NAND11 is high level. The high level output signal from the inverter INV18 is the ATD signal. After the ATD signal of high level is delayed by the delaying part D for the prescribed time and then outputted, the pair of transmission gates TG11 and TG13 having been turned off becomes turned on. Since the inverter INV12 output signal is high level and the inverter INV14 the output signal is low level, an output signal of high level is outputted by the NAND gate NAND11. Thus, the ATD signal from the inverter INV18 returns to low level. Waveforms according to such a series of operations are shown in FIGS. 3E to 3L.

On the other hand, when the address bit AIN goes from high to low level, the PMOS transistor Q11 of the inverter INV11 is turned on and the NMOS transistor Q14 of the inverter INV15 is turned off. In the inverter INV11, although the NMOS transistor Q12 has already been turned on, the pull-up operation progresses rapidly because the PMOS transistor Q11 has the relatively large driving capacity. Accordingly, the pair of inverters INV12 and INV13 produce low level signals at approximately the same time. Since the transmission gate TG12 has been turned on by the low level ATD signal, an output signal of low level from the inverter INV13 is promptly inputted into the inverter INV14. Accordingly, the high level signal from the inverter INV14 is inputted to the NAND gate NAND11. Waveforms of signal according to such a series of operations are shown in FIGS. 4A to 4F.

In the inverter INV15, the pull-up operation progresses slowly because of the PMOS transistor Q13, which was already turned on, once the NMOS transistor Q14 is turned off. The inverter INV16 produces a low level signal without delay. However, the inverter INV17 has not yet produced a low level signal when the transmission gate TG13 is turned off and the transmission gate TG14 was turned on. As an output signal of the inverter INV17 remains high level, the other input signal to the NAND gate NAND11 also stays high level.

An ATD signal, i.e. an output signal of the inverter INV18, becomes high level since both inputs for the NAND gate NAND11 have the values of high level. The high level ATD signal turns on both the transmission gates TG11 and TG13 after being delayed for the prescribed time by the delaying part D.

An output signal of the NAND gate NAND11 is changed to high level when the transmission gate TG13 becomes turned on because of the low level signal from the inverter INV16. Hence, the ATD signal from the inverter INV18 returns to low level. Waveforms of signals according to such a series of operations are shown in FIGS. 4G to 4L.

As described above, the address bit AIN inputted into the preferred embodiment of the address transition detection circuit of the present invention goes to high or low level to produce an ATD signal having a pulse width equal to a delay time of the delaying part D. Such operations are performed under the condition that the address bit input to the preferred embodiment of the address transition detection circuit maintains sufficient pulse width.

However, the preferred embodiment of the address transition detection circuit according to the present invention generates an ATD signal having a normal pulse width even when an address bit of a short pulse has an insufficient pulse width. FIGS. 5A–5L are diagrams that show timing waveforms of operational characteristics of the circuit of FIG. 2 receiving a positive short pulse signal of high level.

In an initial state during which a chip enabling signal CE is activated up to a high level, the NMOS transistor Q12 and the PMOS transistor Q11 of the inverter INV11 are turned on. Even though the PMOS transistor Q11 is instantaneously turned off by the input of a positive short pulse address bit AIN, the output terminal N10 is not pulled down because of a relatively small driving capacity of the NMOS transistor Q12. Hence, the inverter INV11 maintains a high level signal and the output signals of the inverters INV12 and INV13 maintains their initial low level states. The low level output signal from the inverter INV13 is inverted into high level by the inverter INV14 and then inputted into the NAND gate NAND11 since the transmission gate TG12 has been turned on. Waveforms of signals according to such a series of operations are shown in FIGS. 5A to 5F.

The inverter INV15 is producing a signal of high level because the PMOS transistor Q13 has been turned on by the chip enabling signal CEB of low level and the NMOS transistor Q14 has been turned off by the address bit AIN of low level. At this time, even though the positive short pulse address bit AIN is inputted to turn on the NMOS transistor Q14 for a short time, the output terminal N20 experiences a fast pull-down because the driving capacity of the NMOS transistor Q14 is much larger than that of the PMOS transistor Q13. Accordingly, output signals of the inverters INV16 and INV17 become high level at nearly the same time, and an output signal of high level from the inverter INV17 is immediately inputted to the NAND gate NAND11 since the transmission gate TG14 has been turned on.

As both inputs of the NAND gate NAND11 have high level, an output signal of the NAND gate NAND11 is low level. Accordingly, the ATD signal from the inverter 18 becomes high level as well. Once the ATD signal of high level, which is delayed for the prescribed time by the delaying part D, is outputted, both transmission gates TG11 and TG13 become turned on. The transmission gates TG12 and TG14 one turned off. During this time the output signal of the node 21 is low level when the transmission gate TG13 is turned on because the output terminal N20 is pulled up to high level by the PMOS transistor Q13. An output signal of low level from the inverter INV16 is inputted to the NAND gate NAND11 through the turned on transmission gate TG13 and then changes an output signal of the NAND gate NAND11 into high level. Accordingly, the ATD signal outputted from the inverter INV18 returns to low level. Waveforms of signals according to such a series of operations are shown in FIGS. 5G to 5L.

On the other hand, FIGS. 6A–6L are diagrams that show timing waveforms of operational characteristics when a negative short pulse signal of low level is received. Once a negative short pulse address bit AIN is inputted, the PMOS transistor Q11 of the inverter INV11 becomes turned on for a relatively short period in which the output terminal N10 of the inverter INV11 is pulled down to low level by the NMOS transistor Q12 having been turned on. However, the larger driving capacity of the PMOS transistor Q11 relative to the NMOS transistor Q12 is enough to pull up the output terminal N10. Accordingly, signals of low level are produced from the inverters INV12 and INV13 at nearly the same time. At this time, since the transmission gate TG12 has been turned on, an output signal of low level from the inverter INV13 is inverted to high level by the inverter INV14 and then inputted to the NAND gate NAND11.

In the inverter INV15, although both the PMOS transistor Q13 and the NMOS transistor Q14 of which driving capacity is relatively larger than that of the PMOS transistor Q13 are turned on, the output terminal N20 is pulled down to low level. Under this condition, once an address bit AIN of the negative short pulse is inputted, the NMOS transistor Q14 is instaneously turned off. However, the PMOS transistor Q13 is insufficient for pulling up the output terminal N20 since the NMOS transistor Q14, which has the relatively large driving capacity, is only turned off for a short period. Accordingly, an output signal of the inverter INV15 maintains the low level, and output signals of the inverters INV16 and INV17 maintain the high level. During this time, the output signal of high level from the inverter INV17 is immediately inputted to the NAND gate NAND11 since the transmission gate TG14 is turned on.

As both inputs of the NAND gate NAND11 are high level, the ATD signal, which is the output signal from the inverter INV18, becomes high level. When the delayed ATD is output by the delaying part D, the transmission gates TG11 and TG13 are turned on. During this time, the output terminal N10 is pulled down to low level by the NMOS transistor Q12, which is the pull-down transistor of the inverter INV11. Accordingly, the output signal of the inverter INV12 becomes high level as soon as the transmission gate TG11 becomes turned on. The output signal of high level from the inverter INV12 is inputted to the other inverter INV14 through the turned on transmission gate TG11. Hence, the NAND gate NAND11 receives the low level signal from the inverter INV14 and outputs a high level signal. Subsequently, the ATD signal output from the inverter INV18 returns to the low level. Waveforms of signals according to such operations are shown in FIGS. 6(A)–6(L).

As described above, the preferred embodiment according to the present invention has various advantages. The preferred embodiment of the address transition detection circuit generates an ATD signal having a normal pulse width although a pulse width much shorter than that of a normal input address bit is received.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An address transition detection circuit, comprising:
   a first delay circuit that receives an address signal, wherein the first delay circuit delays a first level address signal when the address signal transitions from second level to a first level, and wherein the first delay circuit outputs a second level address signal when the address signal transitions from the first level to the second level;
   a second delay circuit that receives the address signal, wherein the second delay circuit delays the second level address signal when the address signal transitions from the first level to the second level, wherein the second delay circuit outputs the first level address signal when the address signal transitions from the second level to the first level, and wherein an output operation of the first and second delay circuits are controlled by a prescribed signal; and
   a control circuit that receives first and second address signals from the first and second delay circuits, respectively, to output an address transition detection signal and the prescribed signal to cancel the delay of the first and second delay circuits after a prescribed interval.

2. The address transition detection circuit according to claim 1, wherein the first delay circuit comprises:
   a first logic circuit that produces a two level first output signal, wherein a second level first output signal is delayed prior to output; and
   a first selector that selects one of second and third output signals based on the first output signal.

3. The address transition detection circuit according to claim 2, wherein the first logic circuit comprises:
   a first inverter that produces the second level first output signal as an initial value, wherein a pull-down operation operates relatively slower than a pull-up operation;
   a second inverter that generates the second output signal by inverting the first output signal; and
   a third inverter that generates the third output signal by inverting the first output signal, wherein the third inverter outputs the third output signal subsequent to the second signal.

4. The address transition detection circuit according to claim 3, wherein the first inverter comprises:
   a pull-up unit controlled by the address signal, to pull up an output terminal of the first inverter; and
   a pull-down unit controlled by an initiating signal to pull down the output terminal of the first inverter, wherein the pull-down unit has less driving capacity than the first pull-up unit.

5. The address transition detection circuit according to claim 4, wherein a ratio of width vice length of a channel between each first and second electrode of the pull-down unit is smaller than that of the pull-up unit, and wherein the third inverter has a lower logic threshold voltage than the second inverter.

6. The address transition detection circuit according to claim 4, wherein the pull-down unit comprises a plurality of transistors coupled in series having the same size in channel width and length as a transistor of the pull-up unit, and wherein each gate of a subset of the plurality of transistors receives a power supply voltage.

7. The address transition detection circuit according to claim 3, wherein the first selector comprises:
   a first transmission gate that selectively passes the second output signal based on the prescribed signal;
   a second transmission gate that selectively passes the third output signal based on the prescribed signal, wherein the second transmission gate operates complementary to the first transmission gate; and
   a fourth inverter that outputs the first address signal by inverting output signals of the first transmission gate and the second transmission gate.

8. The address transition detection circuit according to claim 7, wherein the second delay circuit comprises:
   a second logic circuit producing a two level fourth signal, wherein a first level fourth output signal is delayed prior to output; and
   a second selector that selects one of fifth and sixth output signals generated based on the fourth output signal.

9. The address transition detection circuit according to claim 8, the second logic circuit comprises:
   a fifth inverter that produces the fourth output signal, wherein a pull-up operation operates relatively slower than a pull-down operation;
   a sixth inverter that generates the fifth output signal by inverting the fourth output signal; and
   a seventh inverter that generates the sixth output signal by inverting the fourth output signal, wherein the third inverter outputs the sixth output signal subsequent to the fifth signal, and wherein the second selector comprises,
      a third transmission gate that selectively passes the fifth output signal as the fourth address signal based on the prescribed signal; and
      a fourth transmission gate that selectively passes the sixth output signal as the fourth address signal based on the prescribed signal, wherein the fourth transmission gate operates complementary to the third transmission gate.

10. The address transition detection circuit according to claim 9, wherein the control circuit comprises:
    a logic gate that logically processes the first and second address signals from the first and second delay circuits, respectively, to output the address transition detection signal; and
    a feed back circuit that receives the address transition detection signal and outputs the prescribed signal, wherein the prescribed signal is a delayed address transition detection signal, wherein the first level and the second level are high and low levels, respectively.

11. The address transition detection circuit according to claim 8, wherein the first and third transmission gate are concurrently on when the prescribed signal is the first level, and wherein the second and fourth transmission gate are concurrently on when the prescribed signal is the second level.

12. The address transition detection circuit according to claim 1, wherein the second delay circuit comprises:
    a logic circuit producing a two level first output signal, wherein a first level first output signal is delayed prior to output; and
    a selector that selects one of second and third output signals generated based on the first output signal.

13. The address transition detection circuit according to claim 12, wherein the logic circuit comprises:
    a first inverter that produces the first output signal, wherein a pull-up operation operates relatively slower than a pull-down operation;
    a second inverter that generates the second output signal by inverting the first output signal; and a third inverter that generates the third output signal by inverting the first output signal, wherein the third inverter has a threshold voltage different from the second inverter to output the third output signal subsequent to the second signal.

14. The address transition detection circuit according to claim 13, wherein the first inverter comprises:

a pull-up unit controlled by the address signal to pull-up an output terminal of the first inverter; and a pull-down unit controlled by an initiating signal to pull-down the output terminal, wherein the pull-up unit has less driving capacity than the pull-down unit.

15. The address transition detection circuit according to claim 13, wherein the selector comprises:

a first transmission gate that selectively passes the second output signal based on the prescribed signal as the second address signal; and a second transmission that selectively passes the third output signal based on the prescribed signal as the second address signal, wherein the second transmission gate operates complementary to the first transmission gate.

16. The address transition detection circuit according to claim 15, wherein the control circuit comprises:

a logic gate that logically processes the first and second address signals from the first and second delay circuits, respectively, to output the address transition detection signal; and a feed back circuit that receives the address transition detection signal and outputs the prescribed signal, wherein the prescribed signal is a delayed address transition detection signal, wherein the first level and the second level are high and low levels, respectively.

17. The address transition detection circuit according to claim 1, wherein the control circuit comprises:

a logic gate that logically processes the first and second address signals from the first and second delay circuits, respectively, to output the address transition detection signal; and a feed back circuit that receives the address transition detection signal and outputs the prescribed signal, wherein the prescribed signal is a delayed address transition detection signal, wherein the first level and the second level are high and low levels, respectively.

18. A method of operating an address transition detection circuit, comprising:

receiving an address signal;

delaying a first level address signal when the address signal transitions from a second level to a first level and outputting a second level address signal when the address signal transitions from the first level to the second level with a first delay circuit;

delaying the second level address signal when the address signal transitions from the first level to the second level and outputting the first level address signal when the address signal transitions from the second level to the first level with a second delay circuit;

selecting an output signal from the first and second delay circuits;

combining the selected output signal from the first and second delay circuits to generate an address transition detection signal; and feeding back a prescribed signal after a prescribed interval to cancel the delay of the first and second delay circuits.

19. An address transition detection circuit, comprising:

a first delay circuit that receives an address signal, wherein the first delay circuit delays a first level address signal when the address signal transitions from second level to a first level, and wherein the first delay circuit outputs a second level address signal when the address signal transitions from the first level to the second level;

a second delay circuit that receives the address signal, wherein the second delay circuit outputs the second level address signal when the address signal transitions from the first level to the second level, wherein the second delay circuit outputs the first level address signal when the address signal transitions from the second level to the first level, and wherein an output operation of the first delay circuit is controlled by a prescribed signal; and a control circuit that receives first and second address signals from the first and second delay circuits, respectively, to output an address transition detection signal and the prescribed signal to cancel the delay of the first delay circuit after a prescribed interval.

20. The address transition detection circuit of claim 19, wherein the second delay circuit delays the second level address signal when the address signal transitions from the first level to the second level, wherein an output operation of the second delay circuit is controlled by the prescribed signal, wherein the control circuit receives the prescribed signal to cancel the delay of the second delay circuit after the prescribed interval, and wherein the first and second delay circuits each comprise an inverter having a pull-down unit and a pull-up unit whose respective driving capacities are not equal.

* * * * *